United States Patent [19]
Lee et al.

[11] Patent Number: 5,661,067
[45] Date of Patent: Aug. 26, 1997

[54] METHOD FOR FORMING TWIN WELL

[75] Inventors: Chang-Jae Lee; Jong Kwan Kim, both of Choongchungbook-Do, Rep. of Korea

[73] Assignee: LG Semicon Co., Ltd., Choongchungbook-do, Rep. of Korea

[21] Appl. No.: 686,767

[22] Filed: Jul. 26, 1996

[30] Foreign Application Priority Data

Jul. 26, 1995 [KR] Rep. of Korea .................. 22240/1995

[51] Int. Cl.⁶ .................................................. H01L 21/265
[52] U.S. Cl. ...................... 438/420; 438/220; 438/527
[58] Field of Search .......................... 437/34, 56, 57, 437/58

[56] References Cited

U.S. PATENT DOCUMENTS

| | | | |
|---|---|---|---|
| 4,434,543 | 3/1984 | Schwabe et al. | 437/34 |
| 5,024,961 | 6/1991 | Lee et al. | 437/34 |
| 5,045,495 | 9/1991 | Teague et al. | 437/70 |
| 5,141,882 | 8/1992 | Komori et al. | 437/34 |
| 5,219,783 | 6/1993 | Moslehi | 437/57 |
| 5,278,085 | 1/1994 | Maddox, III et al. | 437/34 |
| 5,413,944 | 5/1995 | Lee | 437/56 |
| 5,460,984 | 10/1995 | Yoshida | 437/34 |
| 5,559,045 | 9/1996 | Yamamoto | 437/34 |

FOREIGN PATENT DOCUMENTS

| | | | |
|---|---|---|---|
| 0112165 | 9/1979 | Japan | 437/34 |
| 0017656 | 2/1983 | Japan | 437/57 |
| 0202055 | 8/1988 | Japan | 437/56 |
| 0133920 | 5/1990 | Japan | 437/57 |
| 0133921 | 5/1990 | Japan | 437/57 |
| 0188914 | 7/1990 | Japan | 437/57 |
| 405275637 | 10/1993 | Japan | 437/34 |
| 406140589 | 5/1994 | Japan | 437/57 |

*Primary Examiner*—John Niebling
*Assistant Examiner*—Long Pham
*Attorney, Agent, or Firm*—Morgan, Lewis and Bockius LLP

[57] ABSTRACT

An improved twin well formation method for a semiconductor device capable of improving the latch-up characteristic in DRAM device which requires a high integration density and of improving a recess problem which occurs due to the capacitor, which includes the steps of a first step which forms an insulation film on a semiconductor substrate having a first region and a second region; a second step which forms a first temporary film on an insulation film of the first region; a third step which forms a first side wall spacer at the first temporary side wall; a fourth step which implants a first conductive ion to a substrate of a second region; a fifth step which forms a second temporary film on a substrate of the second region; a sixth step which removes the first temporary film; a seventh step which implants a second conductive ion to a substrate of the first region; and an eighth step which anneals and removes the second temporary film and the first insulation spacer.

17 Claims, 7 Drawing Sheets

MEMORY CELL AREA (28) —|— (30) PERIPHERAL CIRCUIT AREA

MEMORY CELL AREA (28) —|— (30) PERIPHERAL CIRCUIT AREA

METHOD FOR FORMING TWIN WELL

BACKGROUND OF THE INVENTION

1. Field of the Invention

The present invention relates to a twin well formation method for a semiconductor device, and in particular to an improved twin well formation method for a semiconductor device capable of improving the latch-up characteristic in DRAM device which requires a high integration density and of improving a recess problem which occurs due to the capacitor.

2. Description of the Conventional Art

Conventionally, a diffusion twin well formation method is directed to developing a relatively thick oxide film on an n-well surface of a substrate, and to forming a well in a self-aligning twin tub with one mask of the thick oxide film which is used as a masking layer during a p-type ion implantation doping process.

FIGS. 1A through 1E show a CMOS twin well formation method in the prior art.

As shown in FIG. 1, a thermal oxide film 12 is developed on a p-type silicon substrate 10 to have a thickness of 100 Å, and a $Si_3N_4$ of a silicon nitride film 14 is developed on the thermal oxide film 12 in an LPCVD method to have a thickness of 1400 Å.

Thereafter, the silicon nitride film 14 is etched with a mask of a photoresist film pattern 16 so as to define an n-well region, and a pattern as shown in FIG. 1B is formed. Phosphorus of $1.0 \times 10^{13}$ ions/cm$^2$ is implanted into the n-well region, and the photoresist pattern 16 is removed, and an annealing process is performed at an environment of 900° C. and $H_2/O_2$ so as to develop n-well drive-in and thermal oxide film.

As a result, as shown in FIG. 1C, an n-well 18 is formed within the silicon substrate, and an oxide film 20 having a thickness of 4500 Å is formed on the n-well 18.

Thereafter, as shown in FIG. 1D, the silicon nitride film 14 of a region, on which a p-well is formed, is removed by dipping it into a hot $H_3PO_4$ liquid, and boron which is in an environment of $5.0 \times 10^{12}$ ions/cm$^2$ and 80 KeV is implanted into a certain region in which the thick oxide film is not formed, and is annealed at an environment of $N_2$ for 4 hours, and a p-well 22 is formed within the silicon substrate.

At this time, the oxide film 20 having a thickness of 4500 Å formed on the n-well 18 is used as an ion implantation mask during a formation of a p-well 22.

Thereafter, as shown in FIG. 1E, the thermal oxide films 12 and 20 are concurrently removed by dipping into HF, and the well formation process is finished. Since the following process thereof is the same as a conventional well-known CMOS device fabrication process, the description thereof will be omitted.

As a result of the above-mentioned process, since the thickness of an oxide film, which is developed when forming an n-well, is about 4000 Å, even though half of the thickness of the substrate is referred to the thickness of the developed oxide film, the recess "d" between the p-well 22 and the n-well 18 is about 2000 Å.

Therefore, in terms of the high integrated device, the following problem generally occur. First, the spacer at a well boundary is increased due to the dopant compensation at a boundary between the n-well and the p-well. Second, the reliability of the device is decreased because of the increased recess between the n-well and the p-well.

In more detail, regarding the spacer development at a well boundary, since the diffusion of the phosphorus dopant of the n-well is increased during the LOCUS process which is directed to annealing the n-well, the boundary is expanded more compared with the n-well boundary at its initial stage. In addition, the p-well becomes adjacent to the n-well since the oxide film on the n-well acts as a boundary between the oxide film and the n-well.

In this regard, the dopant compensation phenomenon occurs in the boundary between the n-well and the p-well during a diffusion process, and it is impossible to control the density of doping. As a result, the real doping density is decreased. That is, the dead spacer between the n-well and the p-well, in which the spacer is not used for the active region of a device, is increased.

Generally, in order to secure the desired latch-up characteristic between the n-well and the p-well, it is necessary to obtain a substantial spacer between wells. However, with the above-mentioned processes, since the dead spacer is increased, the layout scaling for the device of a high integration density has some problems.

Next, regarding the reliability decrease, which is caused due to the recess increase between the n-well and the p-well, since the CMOS twin well of a twin tub construction, which is fabricated in a self aligning process of the conventional LOCUS method, has recesses between the lowered n-well region and the p-well region, different thickness is formed with respect to the PR when depositing a photoresist film with respect to the photolithography process within a certain boundary between the n-well and the p-well.

Generally, when developing the LOCUS oxide film having a thickness of 4000 Å on the n-well, the thickness at the well boundary varies within a range of 10 μm.

Since the pattern dimension exceeds 1.0 μm in the part, that is, the variation of the dimension is within a range of 10% of the pattern width, there is no problem in fabricating the device. As the device becomes high-integrated, the pattern having a width of below 1.0 is required. When the width of the pattern variation is within a range of 0.1 μm, the general error tolerance exceeds 10%, so that it is impossible to design a critical circuit sensitive to the process variation to be within a range of 10 μm.

This limitation becomes a handicap in designing a circuit for the latch-up suppression, so that it is difficult to fabricate a desired device.

The recess of the well region becomes a more serious problem to the DRAM device of which a capacitor is mounted within the p-well region. Referring to FIG. 2A, the reason will now be explained.

The DRAM device having a CMOS twin well structure is generally directed to dispose a memory cell 28 in the p-well 22 and a related driving circuit 30 in the n-well 18. In addition, the capacitor 26 is mounted on the p-well 22 having a recess higher than that of the n-well 18.

Therefore, after forming a capacitor, in the back-end process, the recess difference between the memory cell region (p-well region) 28 and the peripheral circuit region (n-well region) 30 is increased. Generally, the recess difference "d'" between the memory cell region 28 and the peripheral circuit region 10 exceeds 1000 Å.

As described above, when the recess difference becomes great, since the depth of focus (DOF) of the aligner in the photolithography of the contact formation step and the line patterning step departs from its limitation, the critical dimension is not properly controlled. The region in which the depth of focus is beyond the limitation is not properly etched, and the existence remains there, so that a desired wiring pattern cannot be achieved.

This phenomenon becomes more serious due to the variation of pattern width which is caused by the recess, so that the characteristic of a device is deteriorated.

Therefore, in order to overcome the above-mentioned problems, it is required to add an etch-back global process, before a wiring process, which is characterized to depositing a CVD film and etching-back due to a topology recess exceeding the range of the depth of focus even though the method is complex for the mass-production.

In addition, in order to achieve a constant capacitance same as the conventional level in the capacitor region in which the density level of the DRAM device is sharply increased and decreased, a single stack capacitor is adopted instead of the multi-stack capacitor or a cylindrical structure. Therefore, the recess difference between the n-well and the p-well is increased, this becomes a serious problem.

Therefore, in the industry, studies are intensively conducted in order to minimize the recess difference between the n-well and the p-well in the DRAM device of the next CMOS structure.

For example, Hitachi co. introduced a 256 Mb DRAM device as shown in FIG. 2B, which is directed to oxidize the p-well region before forming well, removing the oxide film, and recessing the substrate of the p-well region in advance, the substrate of the n-well region 22 after forming the well compensates the recess difference which are formed the recesses, so that the recess difference "d'" between the memory cell region 28 and the periphery circuit 30.

However, since the above-described method improves only the recess difference as much as the recessed p-well, the reliability of wiring in a fabrication cost increase, a contact of a high aspect ratio, and a high topology is decreased.

SUMMARY OF THE INVENTION

Accordingly, it is an object of the present invention to provide a twin well formation method for a semiconductor device, which overcome the problems encountered in the conventional twin well formation for a semiconductor device.

It is another object of the present invention to provide an improved twin well formation method for a semiconductor device capable of improving the latch-up characteristic in DRAM device which requires a high integration density and of improving a recess problem which occurs due to the capacitor.

To achieve the above objects, in accordance with a first embodiment of the present invention, there is provided a twin well formation method for a semiconductor device, which includes the steps of a first step which forms an insulation film on a semiconductor substrate having a first region and a second region; a second step which forms a first temporary film on an insulation film of the first region; a third step which forms a first side wall spacer at the first temporary side wall; a fourth step which implants a first conductive ion to a substrate of a second region; a fifth step which forms a second temporary film on a substrate of the second region; a sixth step which removes the first temporary film; a seventh step which implants a second conductive ion to a substrate of the first region; and an eighth step which anneals and removes the second temporary film and the first insulation spacer.

DETAILED DESCRIPTION OF THE INVENTION

The present invention is directed to fabricating a twin well in a magnetic alignment method of controlling a side wall spacer instead the magnetic alignment method of adopting a conventional LOCUS method.

Referring to FIGS. 3A through 3G, the twin well formation method for a semiconductor device of a first embodiment according to the present invention will now be explained.

Figure 1A:
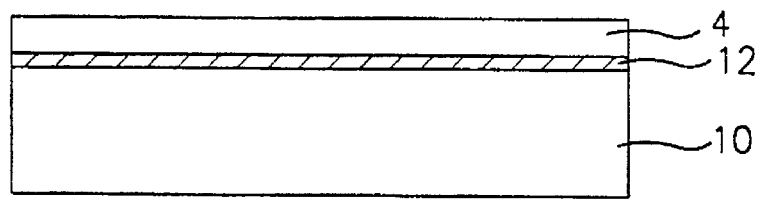
FIGS. 1A through 1E are cross-sectional views to show a CMOS twin well formation method in the prior art.
Figure 1B:
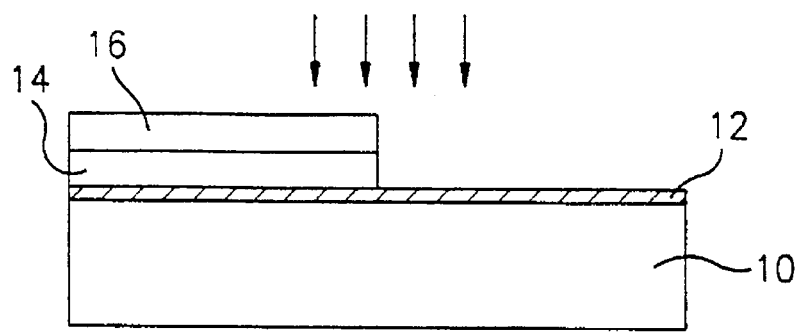
Figure 1C:
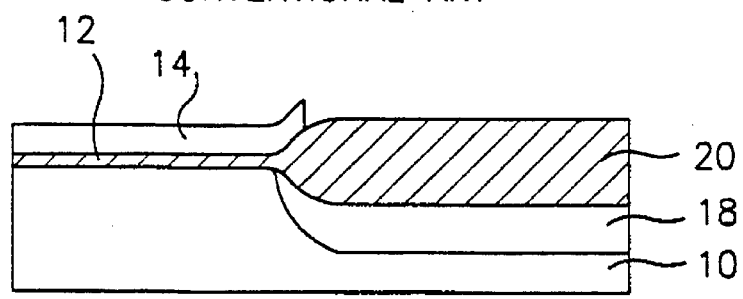
Figure 1D:
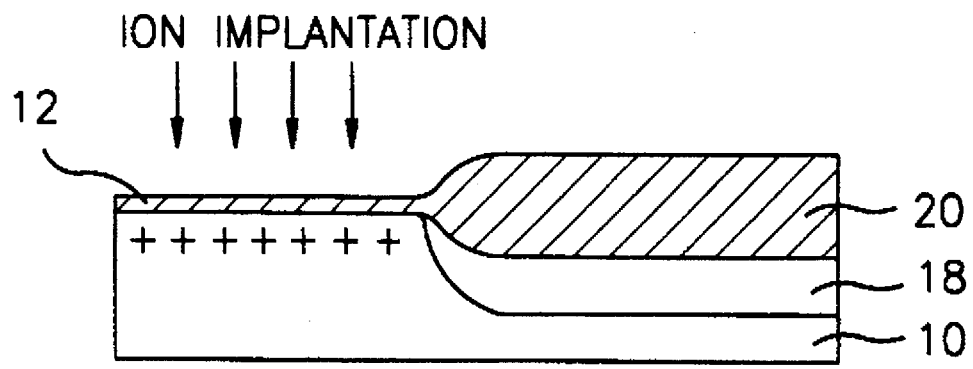
Figure 1E:
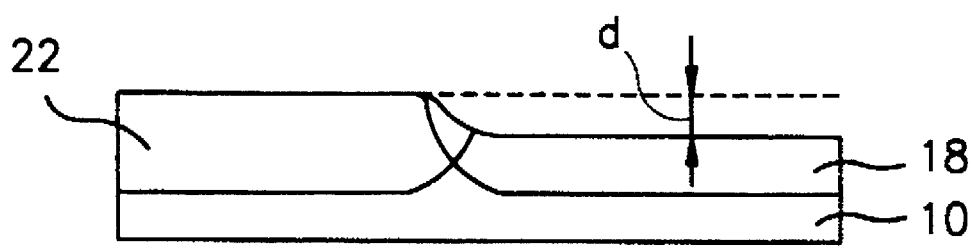
Figure 2A:
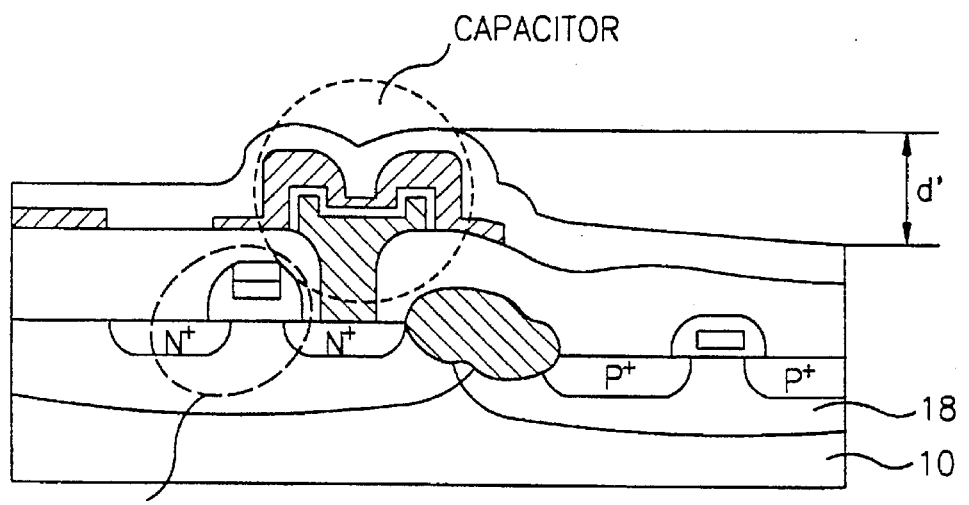
FIGS. 2A and 2B are cross-sectional views of a DRAM cell structure in the prior art.
Figure 2B:
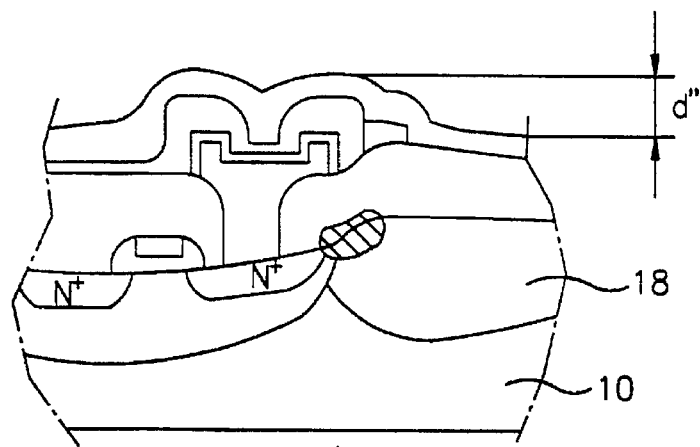
Figure 3A:
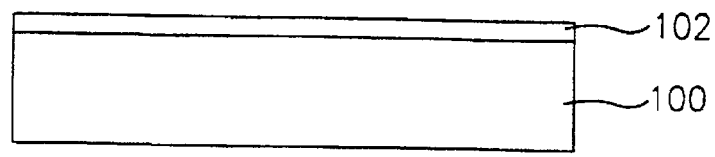
FIGS. 3A through 3G are cross-sectional views to show a CMOS twin well formation method of a first embodiment according to the present invention.

To begin with, as shown in FIG. 3A, a thermal oxide film 102, which is an insulation film, is developed on a p-type silicon substrate 100 in a wet $H_2/O_2$ method at 900° C. to have a thickness of 300 Å. A first temporary film 102 is deposited on the thermal oxide film 102 in an LPCVD method to have a thickness of 2000 Å.

Here, the first temporary film 102 can be formed with any type of material which is capable of forming a photoresist film or a CVD insulation film including a silicon nitride film ($Si_3N_4$) In this embodiment, the silicon nitride film 104 is deposited as the first temporary film 104.

Figure 3B:
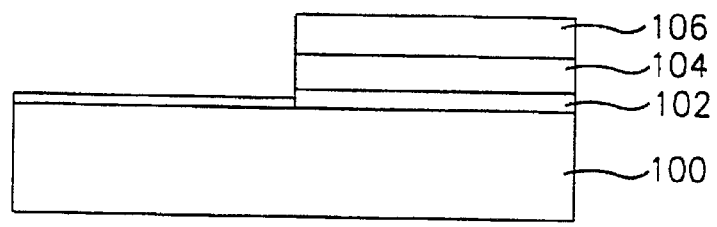

Thereafter, a photoresist film pattern 106 is formed on the first temporary film 104 so as to define one region of the p-well or the n-well irrespective of its order, and the silicon nitride film 104 is removed in a photolithography method, and a pattern as shown in FIG. 3B is formed.

At this time, the silicon nitride film 104 is etched in reactive ion etching method in cooperation with $CHF_3/CF_4$. When the silicon nitride film is etched, the exposed thermal oxide film 102' is also etched by a thickness of 150 Å. The thusly etched portion is used for a trace pattern at the time of a pattern alignment.

Figure 3C:
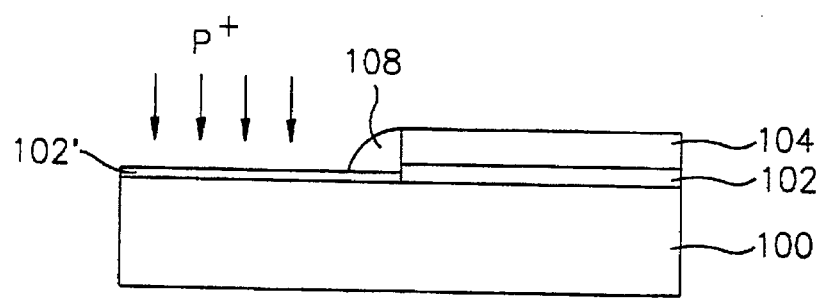

Thereafter, the photoresist film pattern 106 is removed, and a CVD insulation film is conformably deposited on the exposed thermal oxide film 102' including the silicon nitride film 104 to have a thickness of 1500 Å, and the CVD insulation film is etched back by the deposition thickness in a reactive ion etching method without a mask for the anisotropic etching. As shown in FIG. 3C, a first side wall spacer 108 consisting of the CVD insulation film is formed.

Next, a certain dopant is implanted into the exposed thermal oxide film 102' so as to form an n-well and a p-well. Here, in case of forming first the n-well, the phosphorus ion is implanted thereinto at a condition of $1.0 \times 10^{13}$ ions/cm$^2$ and 120 KeV, and in case of forming first the p-well, the boron phosphorus ion is implanted thereinto at a condition of $5 \times 10^{12}$ ions/cm$^2$ and 80 KeV. In this embodiment, preferably, the n-well is first formed.

Figure 3D:
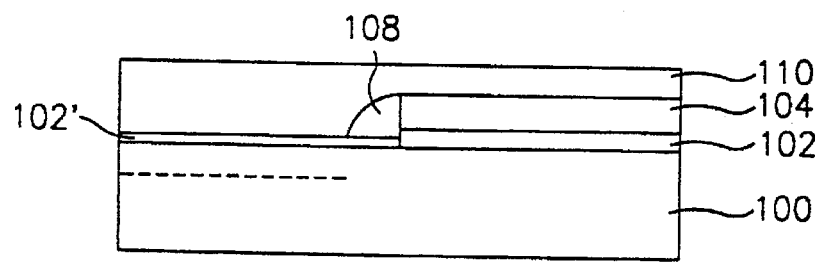

Thereafter, as shown in FIG. 3D, a second temporary film 110 is spin-coated on the thermal oxide film 102' including the first side wall spacer 108 and the silicon nitride film 104. Here, the second temporary film 110 is coated thereon and substantially flat irrespective the curved portion of the substrate.

Here, the second temporary film 110 is referred to either a photoresist film or a spin-on-glass (SOG). In this embodiment, it is preferably referred to the coated photoresist 110.

Figure 3E:
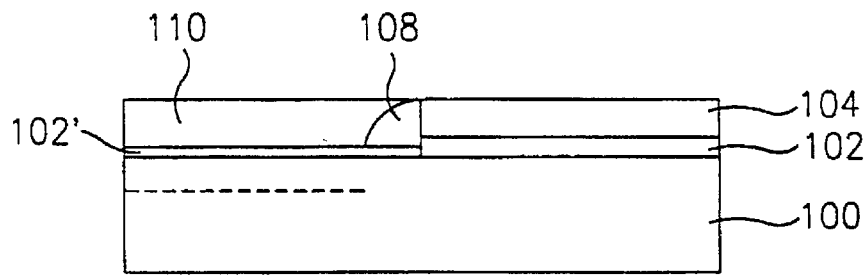

In addition, as shown in FIG. 3E, the surface of the photoresist 110 is etched in either the chemical mechanical polishing method or an anisotropic ion etching method while keeping a certain flatness until the surface of the silicon nitride film 104 is exposed.

Figure 3F:
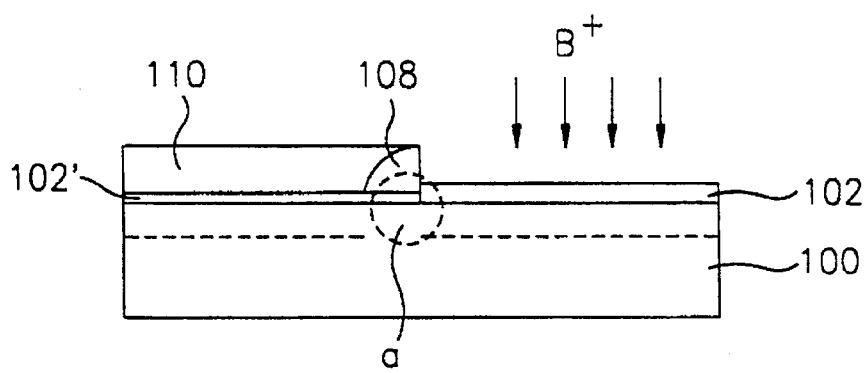

Thereafter, as shown in FIG. 3F, the silicon nitride film 104 is implanted into a hot $H_3PO_4$ having over 150° C., and boron is implanted thereinto in the ion implantation method at the above-mentioned condition for doping a p-well on the exposed thermal oxide film 102. At this time, none of ions of the n-type or the p-type int not implanted into the substrate region in which the first side wall spacer 108 is not formed.

Figure 3G:
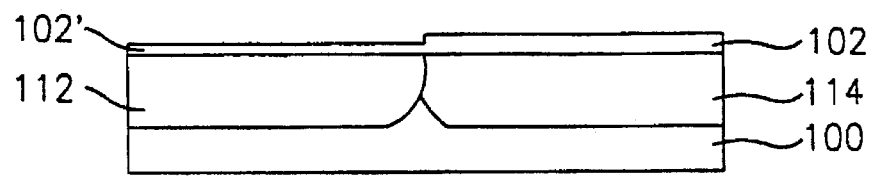

Thereafter, as shown in FIG. 3G, the photoresist film 110, which is the second temporary film, is removed by dipping it into the solution of $H_2O_2/H_2SO_4$, and the first side wall spaced 108 is removed by dipping it the diluted HF water solution.

At this time, in case that the photoresist 110 is well removed because the surface thereof is damaged during the ion implantation process, when the photoresist is first removed in the dry etching method before dipping it into the $H_2O_2/H_2SO_4$, the photoresist 110 is well removed.

Thereafter, for the junction of the n-well and the p-well and the dopant activation, it is desired to anneal for about 4 hours at 1150° C. and in an $N_2$ environment.

At this time, as the n-type or p-type dopant is diffused into the interior of the substrate 100, and the n-well region 112 and p-well region 114 are formed. The side wall diffusion is performed from the boundary between the n-well region 112 and the p-well region 114 to the boundary region "a" of the substrate which the first side wall spacer 108 was formed before.

As a result, because the region in which density is not controlled due to the mixed dopant is decreased compared with the prior art, more fine n-well and p-well can be achieved. In addition, it is possible to achieve a semiconductor device with twin well having no recess between wells.

Therefore, problems caused by the recess between the n-well 112 and the p-well 114 and a wider well boundary can be improved.

Meanwhile, the processes, as shown in FIGS. 4A through 4G, of a second embodiment according to the present invention will now be explained.

In this embodiment, the processes of FIG. 4A through 4F are the same as the processes as shown in FIGS. 3A through 3F. So, only the different processes will now be explained.

Figure 4A:
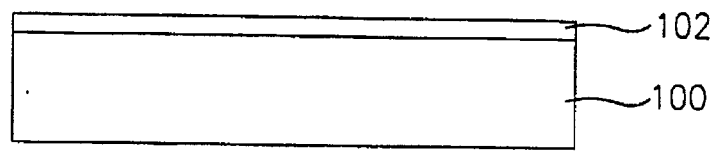
FIGS. 4A through 4G are cross-sectional views to show a CMOS twin well formation method of a second embodiment according to the present invention.
Figure 4B:
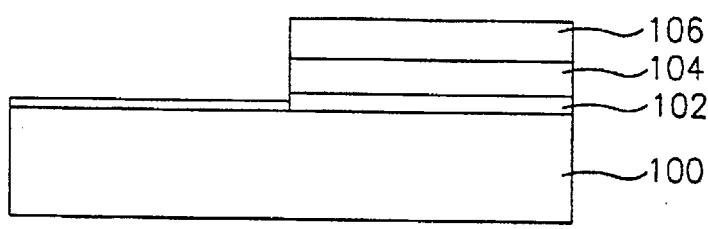
Figure 4C:
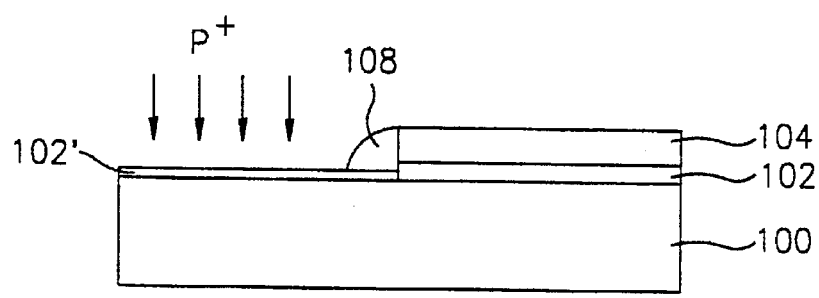
Figure 4D:
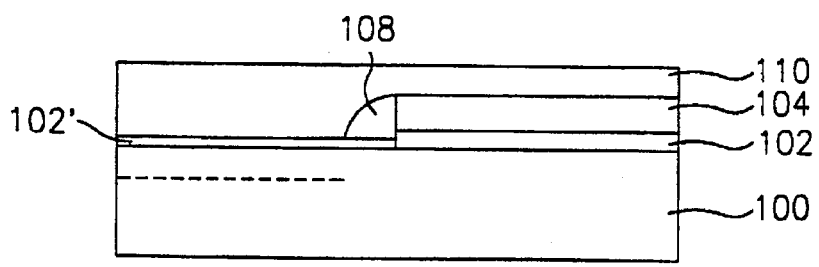
Figure 4E:
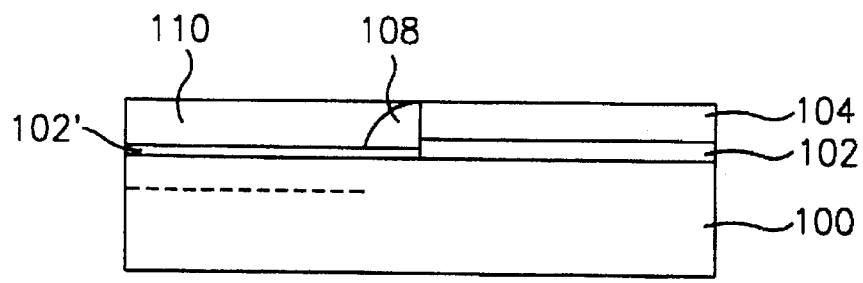
Figure 4F:
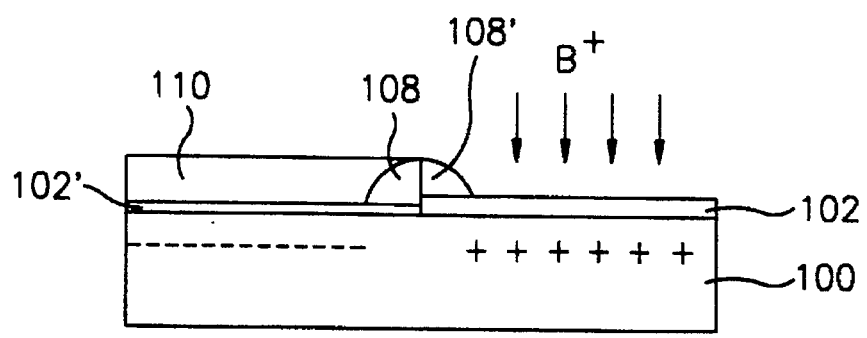

As shown in FIG. 4F, in order to form a second side wall spacer forming with a CVD insulation film on a region on which a p-well is formed, the CVD insulation film is formed on the thermal oxide film 102 including the second temporary photoresist film 110 and the first side wall spacer 108 to have a thickness of 2000 Å, and is etched back to have a deposition thickness of the CVD insulation film without a mask in reactive ion etching method for the anisotropic etching, and a second side wall spacer 108' is formed.

Thereafter, the boron ion is implanted into the exposed thermal oxide film 102 so as to dope the p-well at a condition of $5 \times 10^{12}$ ions/cm$^2$ and 80 KeV.

Figure 4G:
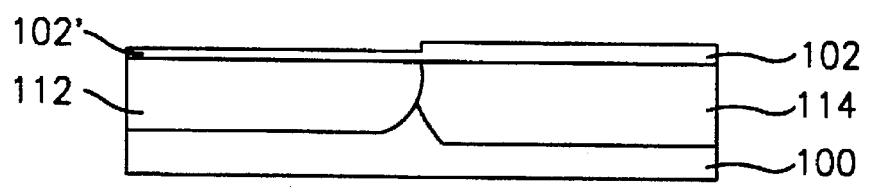

In addition, as shown in FIG. 4G, the photoresist film 110 is removed by dipping it into a compound solution of $H_2O_2/H_2SO_4$, and the first side wall spacer 108 and the second side wall spacer 108' are removed by dipping them into diluted HF water solution and an n-well region 112 and a p-well region 114 are formed at the ion implantation through a drive-in process.

As described above, the twin well formation method for a semiconductor device is directed to fabricating a twin well in a self-alignment method capable of controlling first and second side wall spacer, so that boundary region, in which it is difficult to control density at the n-well and p-well boundary which is a problem in a conventional twin well fabrication, can be advantageously reduced, thus improving the latch-up characteristic. In addition, the latch-up related characteristic can be improved at the boundary region. Moreover, it is possible to improve the problems of the high-integrated density in accordance with a CD variation at the time of forming the pattern due to the recess between the n-well and the p-well. Furthermore, it is possible to enhance a wiring reliability of the high-integrated DRAM device.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A twin well formation method for a semiconductor device, comprising the steps of:
    a first step which forms an insulation film on a semiconductor substrate having a first region and a second region;
    a second step which forms a first temporary film on said insulation film of said first region;
    a third step which forms a first side wall spacer at a side wall of said first temporary film;
    a fourth step which implants a first conductive ion to a substrate of a second region;
    a fifth step which forms a second temporary film on a substrate of said second region;
    a sixth step which removes the first temporary film;
    a seventh step which implants a second conductive ion to a substrate of the first region; and
    an eighth step which anneals and removes the second temporary film and the first side wall spacer.

2. The method of claim 1, wherein said first temporary film is formed with either a silicon nitride film or a photoresist film or a CVD insulation film.

3. The method of claim 1, wherein said second step includes the sub-steps of:
    a first sub-step which deposits a first temporary film on an insulation film;
    a second sub-step which forms a photoresist pattern on said insulation film of a first region and etches said first temporary film using said first region as a mask; and
    a third sub-step which removes said photoresist pattern.

4. The method of claim 3, wherein said insulation film of said second region is etched by a certain thickness when etching the first temporary film with a mask of the photoresist film pattern.

5. The method of claim 1, wherein said first side wall spacer is formed with a CVD insulation film.

6. The method of claim 1, wherein said third step includes the sub-steps of:
    a first sub-step which deposits a CVD insulation film on an insulation film of an exposed second region including the first temporary film; and
    a second sub-step which etches back said CVD insulation film by a thickness of said deposition in a reactive ion etching.

7. The method of claim 5, wherein said third step includes the sub-steps of:
   a first sub-step which deposits a CVD insulation film on an insulation film of an exposed second region including the first temporary film; and
   a second sub-step which etches back said CVD insulation film by a thickness of said deposition in a reactive ion etching.

8. The method of claim 1, wherein said second temporary film is formed with either a photoresist film or an SOG film.

9. The method of claim 1, wherein said second temporary film is spin-coated.

10. The method of claim 1, wherein said fifth step includes the sub-steps of:
    a first sub-step which deposits a second temporary film on said insulation film including said first side wall spacer and said first temporary film; and
    a second sub-step which etches said second temporary film until a surface of said first temporary film.

11. The method of claim 10, wherein said second temporary film is etched by either the chemical mechanical polishing or the anisotropic etching.

12. The method of claim 1, wherein said twin well formation method for a semiconductor device further includes a step which implants a second conductive type ion and removes the surface of the second temporary film in a dry etching.

13. The method of claim 1, wherein said twin well formation method for a semiconductor device further includes a step which removes the first temporary film and forms a second side wall spacer.

14. The method of claim 13, wherein said second side wall spacer is formed with a CVD insulation film.

15. The method of claim 13, wherein said step of forming the second side wall spacer includes the sub-steps of:
    a first sub-step which deposits a CVD oxide film on said insulation film of a first region including said second temporary film and said first side wall spacer; and
    a second sub-step which etches back said CVD insulation film by a thickness of the CVD insulation film in the reactive ion etching.

16. The method of claim 1, wherein said twin well formation method for a semiconductor device further includes a step which removes a second side wall spacer when removing said second temporary film and said first spacer.

17. The method of claim 3, wherein said twin well formation method for a semiconductor device further includes a step which removes said second side wall spacer when removing said second temporary film and said first side wall spacer.

* * * * *

UNITED STATES PATENT AND TRADEMARK OFFICE
CERTIFICATE OF CORRECTION

PATENT NO. : 5,661,067
DATED : August 26, 1997
INVENTOR(S) : Chang-Jae LEE et al.

It is certified that error appears in the above-identified patent and that said Letters Patent is hereby corrected as shown below:

Column 8, line 19, change "said first" to --said first side wall--.

Signed and Sealed this

Ninth Day of February, 1999

Attest:

*Attesting Officer*

*Acting Commissioner of Patents and Trademarks*